United States Patent [19]
King et al.

[11] Patent Number: 5,675,754
[45] Date of Patent: Oct. 7, 1997

[54] GRAPHICAL DISPLAY FOR AN ENERGY MANAGEMENT DEVICE

[75] Inventors: William A. King, Lithonia; James Oliver Alexander, Atlanta, both of Ga.; Jeffrey Alan Jenkins, Fort Collins, Colo.

[73] Assignee: Siemens Energy & Automation, Inc., Alpharetta, Ga.

[21] Appl. No.: 694,801

[22] Filed: Aug. 9, 1996

Related U.S. Application Data

[63] Continuation of Ser. No. 315,522, Sep. 30, 1994, abandoned.

[51] Int. Cl.$^6$ .................................................. G06F 17/30
[52] U.S. Cl. ................................... 395/333; 395/334
[58] Field of Search ............................... 395/161, 326, 395/327, 328, 329, 330, 331, 332, 333, 334, 335; 364/480; 422/243; 361/93; 378/101; 340/843

[56] References Cited

U.S. PATENT DOCUMENTS

| | | | |
|---|---|---|---|
| 4,106,448 | 8/1978 | Noguchi et al. | 123/268 |
| 4,672,555 | 6/1987 | Hart et al. | 364/483 |
| 5,103,679 | 4/1992 | Porter et al. | 73/843 |
| 5,220,479 | 6/1993 | Fraisse | 361/97 |
| 5,303,113 | 4/1994 | Goleman et al. | 361/93 |
| 5,315,533 | 5/1994 | Stich et al. | 364/480 |
| 5,339,349 | 8/1994 | Xeno | 378/101 |
| 5,368,826 | 11/1994 | Weltz et al. | 422/243 |
| 5,369,356 | 11/1994 | Kinney et al. | 324/142 |

FOREIGN PATENT DOCUMENTS 0 432 054 A2   6/1991   European Pat. Off. .

OTHER PUBLICATIONS (1) M.S. Farahat et al., "Integrated Approach to Power Systems Analysis and Maintenance," Conference Record of 1900 annual pulp and paper industry technical conference, (18 Jun. 1990), IEEE Industry Applications Soc., Pulp and Paper Industry Committee, pp. 158–163.

(2) Willhelm Offhaus et al., "Entwicklungstendenzen beim digitalen Leitungsschutz," ETZ Elektrotechnische Zeitschrift 113, (Aug. 1992), No. 17, Berlin. DE.

(3) International Search Report, dated Jan. 24, 1996, for International App. No. PCT/US 95/10079.

*Primary Examiner*—Thomas G. Black
*Assistant Examiner*—Ruay Lian Ho

[57] ABSTRACT

A graphics based display for use with an electronic circuit protection device. Briefly stated, a utility-type electric meter or an electronic circuit protection device includes a liquid crystal device display which allows for the graphical display of information. Upon system start-up or key activation, a menu appears which allows for user selection of the information or parameters to be sampled and displayed.

9 Claims, 2 Drawing Sheets

GRAPHICAL DISPLAY FOR AN ENERGY MANAGEMENT DEVICE

This application is a continuation of application Ser. No. 08/315,522 filed Sep. 30, 1994 now abandoned.

FIELD OF THE INVENTION

This invention relates, generally, to graphical displays and more particularly to a graphical display for use in conjunction with utility-type electric meters or electronic circuit protection devices having integral metering functions in order to display power consumption factors, in graphical format.

BACKGROUND OF THE INVENTION

It is becoming increasingly important that the consumption of electrical power by a load be monitored. The reason for such importance relates to cost of operation, maintenance and keeping equipment on-line for purposes such as production, environmental controls and the like. As such, equipment manufacturers are now routinely supplying or incorporating electronic circuit protection devices thereby forming circuit breaker electronic trip units. These electronic circuit protection devices typically incorporate or have the ability to sample waveforms representative of current, voltage, power factor, harmonics, kilowatt hours, var-hours, va-hours, instantaneous power, phase balance/imbalance, phase loading in relation to historical numbers as well as a percentage of maximum level. Moreover, these values can be stored in order to form an historical database which may also include fault data, etc.

Unfortunately, such information is generally only available in alpha-numeric displays which are viewed at the power meter or electronic trip unit. Any other form of display may only be accomplished by down loading the relevant data to another computer either directly or in a network configuration.

Accordingly, it is difficult for an operator to quickly evaluate system performance. It is for this reason that electronic automotive dash boards typically use display graphics information in an analog gauge type format rather than an alphanumeric display. It is known and appreciated that it is quicker and easier to gauge values, performance and the like in a graphics format.

SUMMARY OF THE INVENTION

Accordingly, it is an object of the present invention to produce a display for use with energy measurement equipment which will provide information in a graphical rather than alphanumeric format.

It is yet another object of the present invention to produce a display which does not require a central computer for subsequent processing and display.

It is still another object of the present invention to produce a display which may scroll through a variety of values and functions automatically or manually.

Still a further object of the present invention is to produce graphically displayed data which allows the user to select which information or information set will be displayed automatically as well as the order in which it is displayed.

Finally, it is another object of the present invention to produce a graphical display for an AC load control device, comprising a device for monitoring AC electrical load usage of a load and a graphical display device connected to the device for monitoring AC electrical load usage adapted so as to graphically display at least one parameter of said AC electrical load usage of the load.

DETAILED DESCRIPTION OF THE FIGURES

Reference may be now had to the accompanying figures, in which.

DETAILED DESCRIPTION OF THE PREFERRED EMBODIMENT

Figure 1:
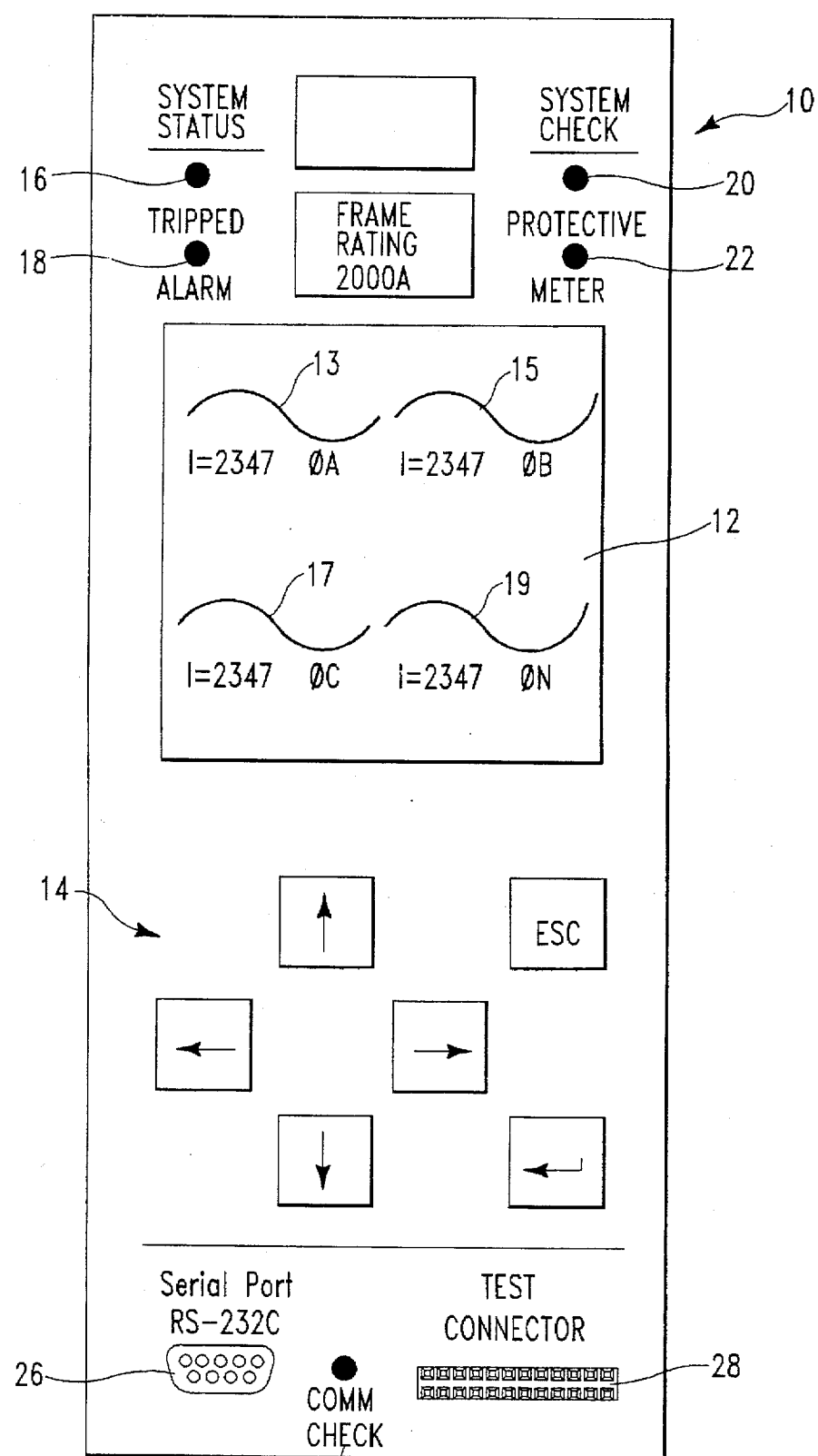
FIG. 1 is a front view of the display and keypad input as well as the graphical display of the present invention.
Figure 2A:
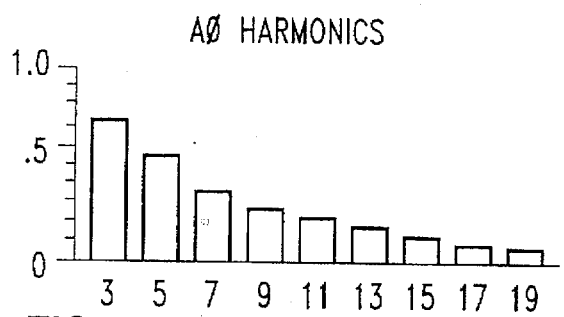
FIGS. 2a, 2b, 2c, 2d are representative of graphs shown on the display of the present invention.
Figure 2B:
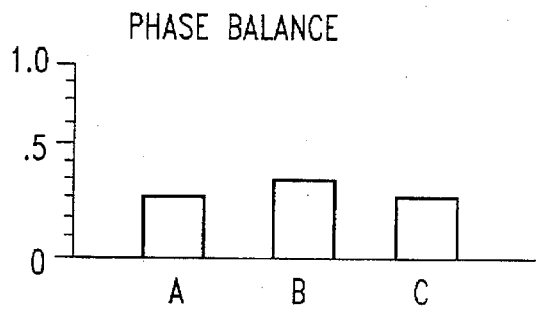
Figure 2C:
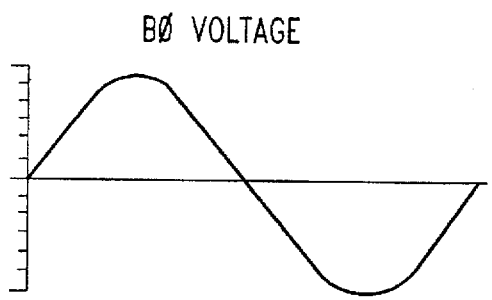
Figure 2D:
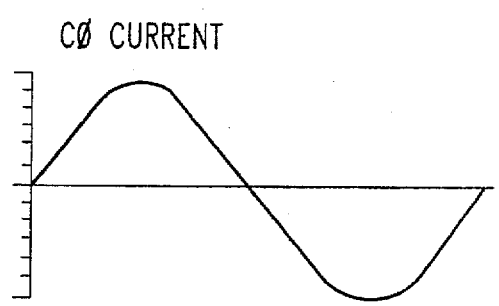

Referring now to FIG. 1 there is shown the front panel 10 of the present invention indicating exemplary information or indicia. As can be seen, the front panel 10 has disposed thereon a liquid crystal device (LCD) display 12, a key-pad input area 14, status indicators 16, 18, 20, 22, and 24 indicating system status, alarm tripping, system check, protective metering, and communications check respectively. Also evident is a communication port 26 as well as a test connector 28.

Shown on LCD display 12 are phase A display area 13, phase B display area 15, phase C display area 17 and phase N display area 19. It is to be understood that although in the preferred embodiment of the present invention the front panel 10 has numerous functions in a particular order, different indicators or layout may be utilized without departing from the spirit and scope of the present invention. In this regard, although LCD Display 12 shows four separate display areas 13, 15, 17 and 19, the number of display areas may be increased or decreased as appropriate as well as the use or elimination of numerical indicia thereunder.

In the preferred embodiment of the present invention, LCD Display 12 is at least a 128 by 128 pixel display although other sizes may be utilized as well as the use of color and the like. Further, the LCD display 12 could be electrofluorescent or any other type of suitable display without departing from the spirit and scope of the present invention.

It is to be understood that the front panel 10 of the present invention and hence the graphic display taught by the preferred embodiment of the present invention cooperates with an electronic trip unit typically utilized with and part of a circuit breaker. Such trip units, frequently referred to as metering trip units, are readily known and available to one skilled in the art and utilize current transformers and electronic circuitry to measure and if necessary calculate a multitude of parameters relating to power being consumed by the load to which they are attached. Accordingly, a more detailed description will not be given. However, it is to be remembered that the present invention may be utilized with any device which monitors or controls power or a load such as, for example, a utility-type electric meter.

As described more fully below, keypad input 14 is utilized to program and/or command the information to be presented by LCD Display 12. Moreover, communication port 26, which in the preferred embodiment of the present invention presents an RS-232 protocol scheme, may be utilized to perform bi-directional communications to accomplish this and other functions as described below. However, it is to be understood that other types of ports may be utilized without departing from the spirit and scope of the present inventions.

Similarly, while test connector 28 is utilized to perform interrogation and testing of panel 10 as well as the breaker (not shown) to which it is attached, the connector may be eliminated or modified as appropriate without departing from the spirit and scope of the present invention.

Figure 3:
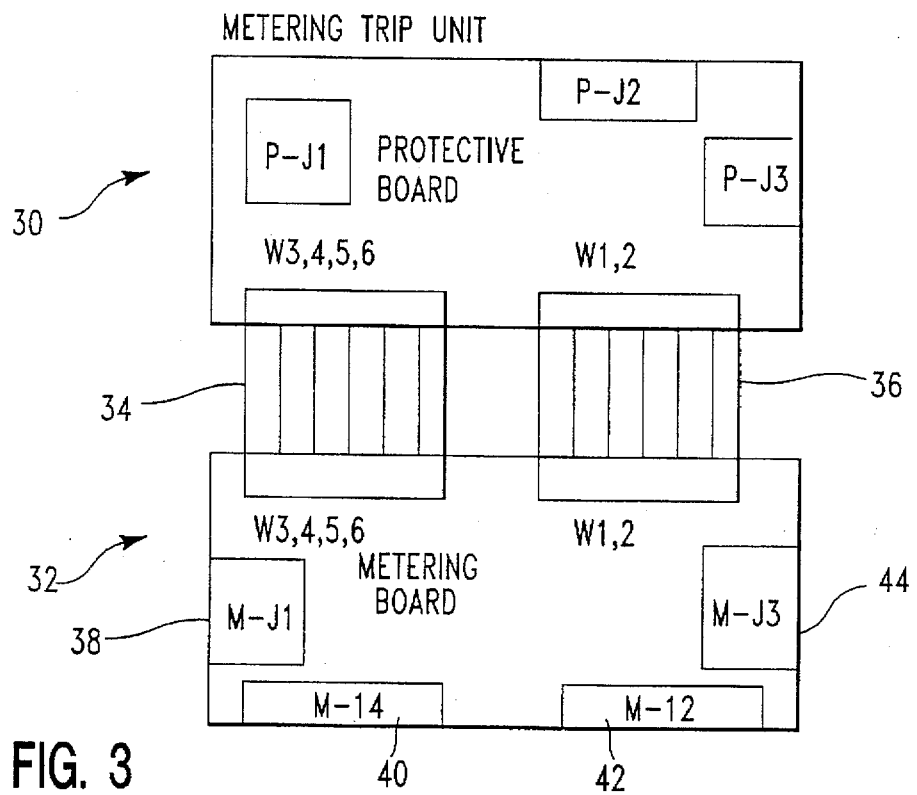
FIG. 3 is an overview of a circuit breaker display interconnect scheme of the preferred embodiment of the present invention.

Referring now to FIG. 3 it can be seen how the display of the present invention is interconnected with the metering and protective boards of the present invention. As is readily known and available to one skilled in the art, a protective board such as 30, which may be functionally part of a metering trip unit, is used to cooperate directly with a circuit breaker, protective relay and the like (not shown). In the preferred embodiment of the present invention protective board 30 cooperates with a circuit breaker (not shown) and performs housekeeping and monitoring functions such as tripping of the breaker, measuring load values and the like. Further, in the preferred embodiment of the present invention a typical circuit breaker is an 'SB' type circuit breaker manufactured and produced by Siemens Energy & Automation of Atlanta, Georgia although other manufacturers equipment could and may be utilized without departing from the spirit and scope of the present invention.

The metering board 32 which is interconnected through wire interconnects 34, 36 with protective board 30 is utilized to process, accumulate and otherwise monitor the power being consumed by the load (not shown), for eventual display by LCD display 12. As can be seen, the metering board 32 has interconnected therewith a plurality of components necessary to operate the control panel 10 and hence the display 12 of the present invention. Accordingly, Jack M-J1 at designated numeral 38 functions as the communication port jack which is ultimately connected to communication port 26 as shown in FIG. 1. Jack M-J4 which is designated numeral 40 cooperates with and is connected to test connector 28 as also shown in FIG. 1. Similarly, terminal M-J2, designated numeral 42 functions as a keypad input jack and cooperates with the keypad 14 as shown in FIG. 1 while Jack M-J3, designated numeral 44 cooperates directly with the actual LCD Display 12 as shown in FIG. 1.

A typical protective board for the mentioned 'SB' circuit breaker utilizes a microprocessor such as, for example, a 68HC11 which has an integral 8 bit A to D converter and which is suitable for the monitoring, housekeeping and protective functions previously mentioned. However, it has been found that when trying to display information in a graphical form, the resolution offered by an 8 bit A to D converter is somewhat lacking. Accordingly, in the preferred embodiment of the present invention, the metering board 32 has an external 12 bit A to D converter which thereafter is interconnected with preferably a 68HC16 microprocessor which is a 16 bit microprocessor.

Therefore, with the use of an external 12 bit A to D converter and a 16 bit microprocessor (not shown) the information presented by graphic LCD display 12 may be sufficiently detailed so as to provide accurate, smooth and useful graphics based graphical and alphanumeric information on display 12.

Reference may be now had to FIGS. 2a, 2b, 2c and 2d which indicate exemplary graphical information which may be displayed by LCD Display 12. Accordingly such types of information may include but are not limited to harmonics amongst any of the conductors, phase balance between the three phases, voltage on any of the three phases as well as current among the three phases and of course the neutral conductor parameters may also be viewed.

Operation and implementation of LCD Display 12 is relatively simple and will now be described. Although, other types of keypads such as, for example, alphanumeric may be utilized, in the preferred embodiment of the present invention a simple six button keypad input such as 14 having Up, Down, Left, Right, Escape and Enter keys is sufficient. In this regard, keypad input 14 cooperates with the mentioned 68HC16 microprocessor (not shown) contained on metering board 32 and functions in conjunction with software so as to provide a menu style operation for LCD display 12.

Although the LCD display 12 is capable of operating in a "pure" graphics mode thereby allowing access to each individual pixel, in the preferred embodiment of the present invention, rather than having a microprocessor update each pixel during a write command thereby creating a "clunky" or "jagged" screen update, a separate RAM is used. By using a RAM in conjunction with a microprocessor and hence as a buffer area for the LCD display, individual bit manipulations are allowed and done in RAM rather than individual LCD pixel manipulations at the display. This has the advantage of allowing the RAM to be periodically "dumped" to the LCD in a block and thereby making the screen update appear much more smooth. This is found to be much more desireable and convenient from the users standpoint when the user "goggles" between menus or information on the display.

By use of the term "graphical" display in the present invention, it is specifically meant to mean and include graphics as is presently used and understood in the industry, that is the ability to display information in an 'analog' fashion, and not merely the use of a 'graphics' display capable of only showing alphanumeric characters.

Further, although software is utilized to interact with protective board 30, metering board 32 and hence display 12, it is to be understood that the writing of such software is within the purview of one skilled in the art and therefore a description of the actual code is not included herein. Moreover, the actual code would of course change depending upon the microprocessors and other hardware elements utilized.

As previously recited, the types of information and the format in which it is displayed is selectable by menus which may be created, maintained or prestored. Menus, in the preferred embodiment of the present invention also include housekeeping items such as contrast adjustment for the LCD display. This is accomplished simply by having the appropriate menu appear on the screen and using the Up or Down keys to adjust the contrast. It has been found that adjustable contrast is a necessary and important feature due to the great variety of lighting environments in which equipment of the present invention is installed.

Upon system start-up, in the preferred embodiment of the present invention, a Sign-On screen will display housekeeping items such as the version number of the software, copyright notices, logos and the like. Thereafter, when any key is pressed the highest level menu choices available will be displayed. These choices are from a category standpoint, Protective, Metering, Communications and logs. The Protective menu has selections for the long time, instantaneous, short-time and ground fault settings. The Metering menu has selections for metered data, alarms, protective relays, and demand period. The Communications menu has selections for EIA-485 settings as well as EIA-232 settings. The log menu has selections for the min-max metering log, the trip log, as well as clearing the min-max log and clearing the trip log.

Further, the metering/metered data menu has selections for the meter screen and graphs while the metering/alarms menu has selections for all the metering alarm settings. Similarly, the metering/protective relay menu has selections for all the metering protective relay settings.

The metering/metered data/meter screen will display all the metered data on a single screen in text form while the metering/metered data/graphs menu will have selections to display graphs for items such as total harmonics, phase current loading and balance, phase A, B and C voltage waveforms and phase A, B and C current waveforms (see e.g. FIGS. 2A–2D).

The log/trip log screen displays the most recent trip event as well as at least two trip events prior to the most recent event also recalled. Additionally, the log/min-max metering log displays a menu of all metered values. Therefore, when a value is selected, LCD Display 12 will produce a screen showing the values min-max with time stamps adjacent thereto. By pressing the up or down keys as appropriate sequential values will be displayed on the screen.

Accordingly, a number of menu items may therefore be produced and simply by pressing the Enter key certain groups contained in the menu may be selected as well as use of the appropriate directional keys to toggle through the various menus displayed. Therefore, other than during start-up as described above, the arrow keys will highlight the category/graph/menu which may be selected. Thereafter, by pressing the Enter key, a particular menu selection will show the sub-menu items or display of an actual graph or data. In this regard, in the preferred embodiment of the present invention, the menu outline is provided in a heirarchichal format as shown below, although this may be changed as required.

---

Menu Outline

---

Sign-on Screen

Protective

Long Time Settings
        Instantaneous Settings
        Short Time Settings
        Ground Fault Settings Metering Metered Data
            Meter Screen
            Graphs
                Total Harmonics
                Phase Current Loading & Balance
                Phase A Voltage Waveform
                Phase B Voltage Waveform
                Phase C Voltage Waveform
                Phase A Current Waveform
                Phase B Current Waveform
                Phase C Current Waveform
        Alarms
            Over Current Settings
            Ground Over Current Settings
            Over Amp Demand Settings
            Total Harmonics Settings
            Over KW Settings
            Over KW Demand Settings
            Over KVAR Settings
            Over KVA Settings
            Under Power Factor Lagging Settings
            Over Power Factor Leading Settings
        Protective Relays
            Neutral Over Current Settings
            Current Unbalance Settings
            Under Voltage Settings
            Voltage Unbalance Settings
            Over Voltage Settings

---

-continued

Menu Outline

---

Over Reverse KW Settings
            Under Frequency Settings
            Over Frequency Settings
        Demand Period
Communications EIA-485 settings
        EIA-232 settings Logs Min-Max Metering Log
            Over Current Min-Max
            Ground Over Current Min Max
            Over Amp Demand Min-Max
            Total Harmonics Min-Max
            Over KW Min-Max
            Over KW Demand Min-Max
            Over KVAR Min-Max
            Over KVA Min-Max
            Under Power Factor Lagging Min-Max
            Over Power Factor Leading Min-Max
            Neutral Over Current Min-Max
            Current Unbalance Min-Max
            Under Voltage Min-Max
            Voltage Unbalance Min-Max
            Over Voltage Min-Max
            Over Reverse KW Min-Max
            Under Frequency Min-Max
            Over Frequency Min-Max
    Trip Log
    Clear Min-Max Log
    Clear Trip Log

---

Further, by utilization of port 26, communications may be accomplished directly so that information indicating fault readings and the like may be downloaded while the menus available to the user may be modified as appropriate.

Accordingly, the present invention produces a electronic circuit protection device having an integral graphical function which provides readily accessible and useful graphical information along with a convenient mechanism to view or alter that which is seen.

It is to be understood that many variations from the present invention may be practiced without departing from the spirit and scope of the present invention. Such variations may include, for example, a different set of microprocessors, memory devices and the like or the way in which the display is interconnected with a circuit protection device. Further, a cursor arrangement available on the screen may be utilized or a touch operated screen may be utilized. Additionally, screens having higher or lower resolution may be utilized as well as larger or smaller screens without departing from the spirit and scope of the present invention. Further, the menu choices may be expanded or minimized to reflect user requirements.

Accordingly, the present invention is not to be limited by the specification but rather by the claims appended hereto.

What is claimed is:

1. A graphical display for an AC load control device, comprising:

a circuit protective device for interrupting electrical power to a load;

a device for monitoring AC electrical load usage of the load including a first means for controlling said circuit protective device and a second means for producing a plurality of signals representative of at least one of the current, voltage and power related characteristics of the load; and a graphical display device connected to said device for monitoring AC electrical load usage, said graphical display device adapted so as to graphically display a plurality of parameters of the AC electrical load usage of the load in waveform and histogram formats simultaneously, said graphical display device including (1) a metering means connected to said second means for receiving and processing said plurality of signals into a plurality of graphical data signals, for storing the plurality of graphical data signals and for producing graphics related output image signals for display in graphical form, said metering means comprising:

an Analog to Digital converter having a sufficient number of bits to receive and process said plurality of signals into a plurality of high resolution graphical data signals; and a microprocessor connected to said Analog to Digital converter for processing the plurality of graphical data signals into the graphics related output image signals, and (2) a display means connected to said metering means and adapted to receive said graphics related output image signals for producing graphic images of the processed signals in waveform and histogram formats which are simultaneously viewable by a user.

2. A device according to claim 1, wherein said circuit protective device is a circuit breaker.

3. A device according to claim 1, wherein said display means comprises a liquid crystal device display.

4. A device according to claim 3 wherein said liquid crystal device display is at least 128 pixels square.

5. A device according to claim 1, further comprising a Random Access Memory (RAM) device connected to said microprocessor for storing the plurality of high resolution graphical data signals.

6. A device according to claim 1 wherein said display means comprises an Electrofluorescent display.

7. A device according to claim 1, wherein said display means is comprised of an Electrofluorescent display.

8. A device according to claim 1, wherein the display means simultaneously produces graphic images of the processed signals representing (1) voltage and (2) current by waveforms, and (3) harmonics and (4) phase balance in histogram format.

9. A modular display device for an AC load control monitoring device, comprising:

a panel;

a graphical display device integral to the panel including a connector adapted to be coupled to the AC load control device, comprising:

(a) a circuit protective device for interrupting electrical power to a load;

(b) a device for monitoring AC electrical load usage of the load including a first means for controlling said circuit protective device and a second means for producing a plurality of signals representative of at least one of the current, voltage and power related characteristics of the load; and (c) a graphical display device connected to said device for monitoring AC electrical load usage, said graphical display device adapted so as to graphically display a plurality of parameters of the AC electrical load usage of the load in waveform and histogram formats simultaneously, said graphical display device including (1) a metering means connected to said second means for receiving and processing said plurality of signals into a plurality of graphical data signals, for storing the plurality of graphical data signals and for producing graphics related output image signals for display in graphical form, said metering means comprising:

(i) an Analog to Digital converter having a sufficient number of bits to receive and process said plurality of signals into a plurality of high resolution graphical data signals; and (ii) a microprocessor connected to said Analog to Digital converter for processing the plurality of graphical data signals into the graphics related output image signals, and (2) display means connected to said metering means and adapted to receive said graphics related output image signals for producing graphic images of the processed signals in waveform and histogram formats which are simultaneously viewable by a user;

a keypad integral to the panel including a connector adapted to be coupled to the AC load control monitoring device to specify information to be displayed on the graphical display device; and a communications interface integral to the panel including a connector adapted to be coupled to the AC load control monitoring device.

* * * * *